United States Patent [19]

Ries et al.

[11] Patent Number: 4,590,452
[45] Date of Patent: May 20, 1986

[54] MAGNETIC DEVICE OF APPARATUS IN NUCLEAR SPIN TOMOGRAPHY WITH A SHIELDING DEVICE

[75] Inventors: Günter Ries; Horst Siebold, both of Erlangen, Fed. Rep. of Germany

[73] Assignee: Siemens Aktiengesellschaft, Munich, Fed. Rep. of Germany

[21] Appl. No.: 640,607

[22] Filed: Aug. 14, 1984

[30] Foreign Application Priority Data

Sep. 19, 1983 [DE] Fed. Rep. of Germany ....... 3333755

[51] Int. Cl.⁴ ................................................ H01F 7/00
[52] U.S. Cl. ...................................... 335/301; 324/320
[58] Field of Search ................ 335/214, 301; 324/318, 324/319, 320, 321, 322

[56] References Cited

U.S. PATENT DOCUMENTS

| | | | |
|---|---|---|---|
| 4,409,579 | 10/1983 | Clem | 335/216 |
| 4,484,814 | 11/1984 | Kawaguchi et al. | 335/301 |
| 4,490,675 | 12/1984 | Knuettel et al. | 324/319 |
| 4,509,011 | 4/1985 | Sugimoto et al. | 324/318 |

FOREIGN PATENT DOCUMENTS

| | | | |
|---|---|---|---|
| 0021535 | 6/1980 | European Pat. Off. | 335/301 |
| 0067933 | 4/1982 | European Pat. Off. | 335/302 |
| 2921252 | 12/1979 | Fed. Rep. of Germany | 335/301 |

OTHER PUBLICATIONS

Nature, "Image Formation by Induced Local Interactions: Examples Employing Nuclear Magnetic Resonance", P. C. Lauterbur, vol. 242, Mar. 16, 1973, pp. 190, 191.

Primary Examiner—George Harris
Attorney, Agent, or Firm—Kenyon & Kenyon

[57] ABSTRACT

The magnetic device of a nuclear spin tomography system contains several magnet coils which surround an interior suitable for accommodating a body to be examined, and generate therein an at least largely homogeneous magnetic field. The device also includes an approximately cylindrical shielding device which surrounds the coils and consists of ferromagnetic material, and has at each end face thereof, a washer-shaped part with a central opening with a predetermined radius with respect to the cylindrical axis, in order to make possible good lateral access to the magnet coils and to provide sufficient space for laterally protruding parts. At least four beam-like shielding elements of identical design are used to form the approximately cylindrical part of the shielding device, the elements being uniformly distributed in the circumferential direction over the cylindrical surface. The shielding elements may have rectangular or triangular cross-sectional shapes.

20 Claims, 6 Drawing Figures

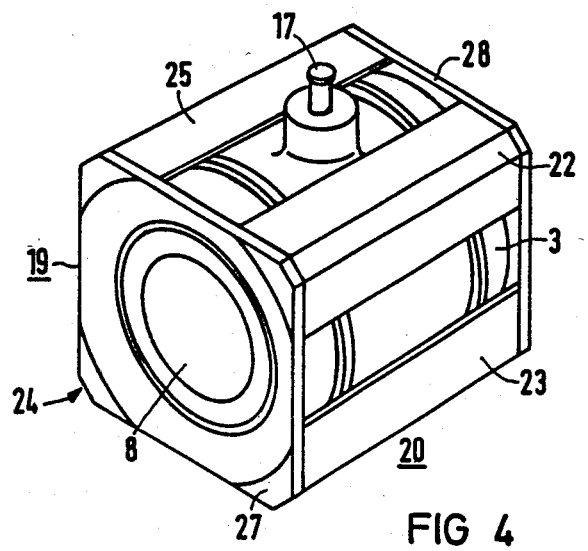
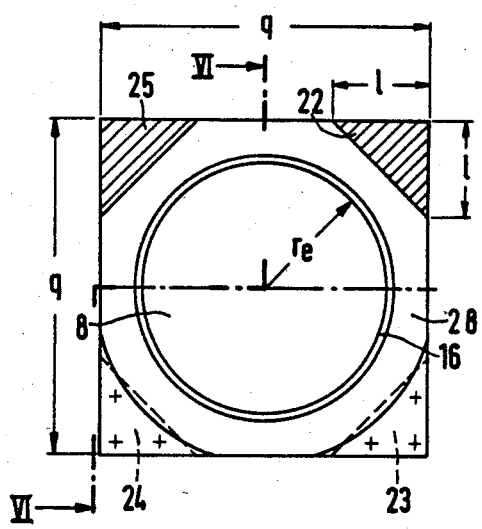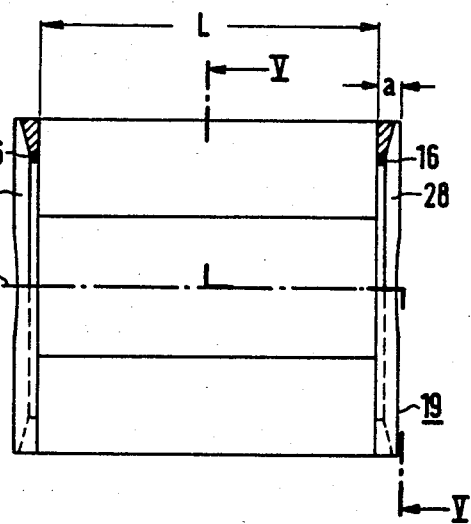
FIG 4
FIG 5
FIG 6

MAGNETIC DEVICE OF APPARATUS IN NUCLEAR SPIN TOMOGRAPHY WITH A SHIELDING DEVICE

BACKGROUND OF THE INVENTION

This invention relates to nuclear spin tomography (nuclear magnetic response (NMR) imaging) in general and more particularly to an improved shielding device for use in nuclear spin tomograph apparatus.

A magnetic device, which is part of apparatus for use in nuclear spin tomography, having several magnet coils which enclose an interior suitable for containing a body to be examined and generate therein an at least largely homogeneous magnetic field, and having a cylindrical shielding device which surrounds the coils; consists of ferromagnetic material; has a part which is at least largely shaped like a cylindrical surface; and has, at each end face, a disc-shaped part with a central opening with a predetermined radius with respect to the cylinder axis is described in European Pat. No. 67 933 A1.

In the field of medical diagnostics, image-forming methods have been developed, in which an image similar to an x-ray tomogram is constructed by computer or measurement analysis of integral resonance signals of nuclei such as protons from the three-dimensional spin density and/or relaxation time distribution of a body to be examined. The corresponding method is also called zeugmatography ("Nature", vol. 242, 1973, pages 190 and 191).

Since, as is well known, the nuclear resonance signal increases with an increasing magnetic base field, a basic field as strong as possible is desired by systems in nuclear spin tomography (nuclear magnetic resonance systems), which field had sufficient homogeneity over a measuring range. On this basic field is superimposed a stationary and/or pulsed gradient field. In addition, a high-frequency field oriented perpendicular to the base field must be provided. The dimensions of the coils needed for forming a magnetic coil arrangement must be matched to the dimensions of the body to be examined so that the body can be inserted without difficulty into the measuring space within an interior surrounded by the coils.

The strong magnetic field of such a magnetic coil arrangement, however, should be contained, substantially only within the measuring space; it should not spread, as far as possible, in the form of a stray field, into the vicinity of the rest of the apparatus where it can lead, for instance, to interference in certain electronic circuits or also can exert certain undesirable forces on ferromagnetic movable parts. Therefore, separate shielding devices are required in order to reduce the stray field outside of the magnet coil arrangement.

Such a shielding device is disclosed, for instance, in European Pat. No. 67 933 A1, mentioned at the outset. This device, which encloses a magnet coil arrangement with a cylindrical, normally conducting field coil, contains a closed cylindrical surface of iron which surrounds the coil. At the end faces of this cylindrical surface, washers of iron with circular central holes are attached, the diameter of which holes is determined substantially by the dimensions of the body to be examined and the required homogeneity of the magnetic field. In addition, the magnet coil arrangement is rigidly fastened to the inside of the shielding device designed in this manner.

Since the known shielding device comprises a closed cylindrical surface, it can be used only for normally conducting, but not for superconducting magnets. For, in such superconducting magnets, lateral openings such as for the so-called turret of the required cryostat as well as for pump nozzles are required. In addition, there is no possibility of adjusting the magnet coils for correcting gradient errors with this device.

It is therefore an object of the present invention to improve the above-mentioned magnetic device with a shielding device in such a manner that the mentioned difficulties are at least largely corrected and where sufficiently high field homogeneity is preserved in the measuring space.

SUMMARY OF THE INVENTION

According to the present invention, this problem is solved by using, as the approximately cylindrical part of the shielding device, at least four beam-like shielding elements of identical design uniformly distributed, with a mutual spacing, in the circumferential direction over the cylindrical surface.

For, the present invention is based on the discovery that it is sufficient for an effective reduction of the stray field outside the magnet coil arrangement, to concentrate the cross section of ferromagnetic material of the known cylindrical part into at least four individual beam-like shielding elements. Due to the spaces so formed between adjacent shielding elements, good lateral access to the magnet coil arrangement and sufficient space for laterally protruding cryostat parts are provided. In the rigid frame of the beam-like shielding elements obtained in this manner and the washer-like parts at the end faces, the magnet coil arrangement can be suspended or arranged adjustably, and the adjustment can be performed in a relatively simple manner.

BRIEF DESCRIPTION OF THE DRAWINGS

FIG. 4 is a schematic oblique view of a further embodiment of a shielding device.

FIG. 5 is a partial cross section of the device of FIG. 4.

FIG. 6 is a longitudinal section of the device of FIG. 4.

DETAILED DESCRIPTION

In nuclear spin tomography system, for which the magnetic device according to the present invention is to be provided, known nuclear spin tomography apparatus is taken as a basis (see, for instance, European Pat. No. 21 535 A1 or DE-OS No. 29 21 252). Such apparatus generally comprises a magnetic device with an arrangement of normally conducting or superconducting field coils, by means of which a strong base field, as homogeneous as possible, can be produced in a central measuring space.

Figure 1:
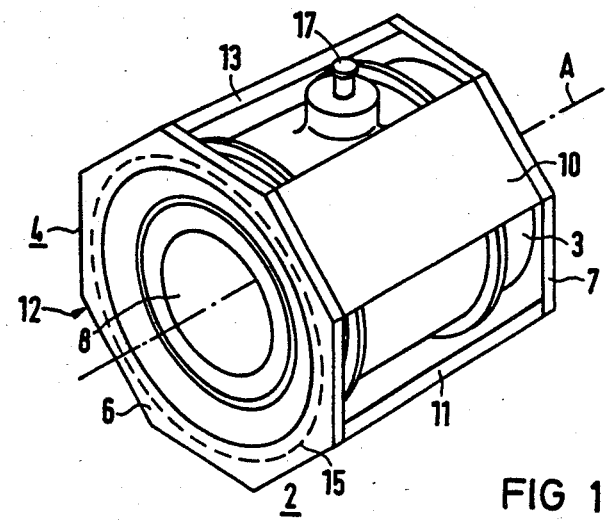
FIG. 1 is a schematic oblique view of a magnetic device according to the present invention with a shielding device.
Figure 2:
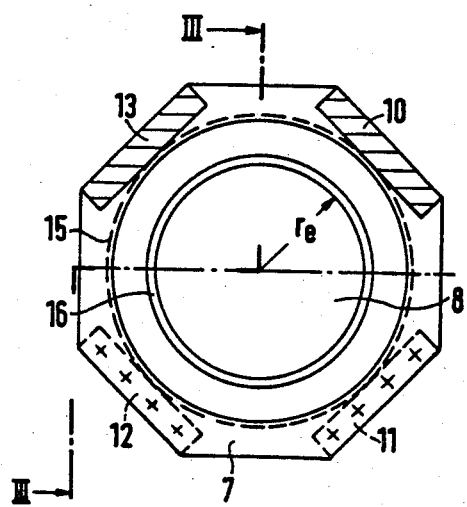
FIG. 2 is a partial cross section of the device of FIG. 1.
Figure 3:
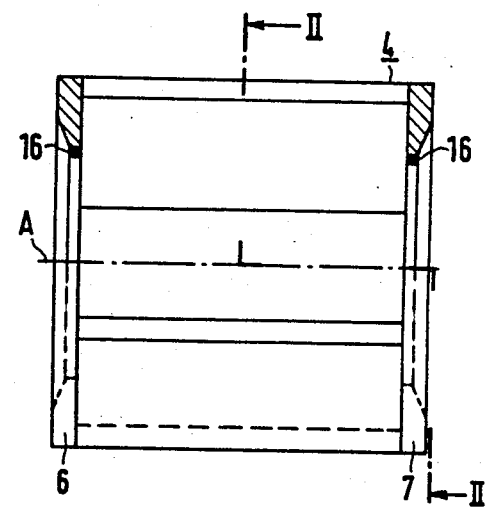
FIG. 3 is a longitudinal section of the device of FIG. 1.

An embodiment of a corresponding magnetic device according to the present invention is indicated in FIGS. 1 to 3. In FIGS. 2 and 3, only the shielding device of this magnetic device is shown. This apparatus, generally designated as 2, preferably comprises a superconducting magnet coil arrangement which is inside a cryostat 3. The magnet coil arrangement and the cryostat permit axial access to a homogeneous field region in its center, i.e., the body to be examined is inserted into the magnetic field along an axis A.

In the center of the homogeneous field region, a magnetic flux density of 0.1 to 2 Tesla is desired. The magnet coils thereby produce a considerable stray field outside the arrangement unless special measures for reducing the stray field are provided. The stray field of relatively short magnets decreases according to an $r^{-3}$ law if it can propogate undisturbed in air. The lines of force connect the exit points from the two poles of the magnets via long paths through the outer space. These lines of force can now be intercepted by introducing them into special ferromagnetic structures where they are concentrated to a flux density of about 1 to 1.5 Tesla, so that the stray field is distinctly lowered outside of these structures.

Accordingly, the magnetic arrangement according to the present invention is equipped with a special shielding device 4 of ferromagnetic material. The shaping of the field is accomplished essentially by the contour of the ferromagnetic material at the entrance and exit points of magnetic flux, i.e., mainly by the form of the ends of the flux return. In order to approach the ideal cylindrically symmetrical form, solid plates 6 and 7, each with a round central hole 8, are provided as end poles at the end faces of the superconducting magnet coil arrangement of the cryostat 3 surrounding it, into which beam-shaped shielding elements 10 to 13, extending in the longitudinal direction, i.e., parallel to the axis A, lead. These elements have uniform shape and are uniformly distributed, on an imaginary cylindrical surface which is indicated by a dashed line 15 and is arranged concentrically with the axis A. The radius $r_e$ of the central hole 8 in the end plates 6 and 7, each plate being in the shape of an equilateral octogon, is chosen so that, on the one hand, sufficient access to the interior of the magnetic device is permitted and, on the other hand, the field error in the usable volume around the center of the coil is minimized. It can be determined relatively simply by tests. For a fine correction of the magnetic field, this radius can further be reduced by inserted rings or shims of ferromagnetic material, so-called shim rings 16.

The beam-shaped shielding elements 10 and 13 and the end plates 6 and 7 form a rigid self-supporting frame in which the magnet coil arrangement is advantageously suspended from adjusting elements not detailed in the Figures. In addition, it is also possible to arrange the magnet coils adjustably on a base frame of their own. With the three degrees of freedom for translation and two degrees of freedom for tilting, five degrees of error (X-Y-X gradient and two second-degree errors) can then be eliminated by the adjustment of the coil arrangement or its coils relative to the frame.

Since it is sufficient for the purposes of nuclear spin tomography to distribute the cross section of ferromagnetic material required for the return of the flux of, for instance, 0.8 m² with a 1-Tesla magnet coil arrangement, over four symmetrically arranged beam-shaped shielding elements, a relatively large space is advantageously obtained between the beams 10 to 13 which is available for a turret 17 of the cryostat 3. Since, furthermore, the necessary iron cross section of the beams can be accommodated in wide, elements which consume less space radially, the distance between the magnetic axis A and the bottom supporting the magnetic device 2 can be kept accordingly smaller. In addition, relatively simple manufacture, assembly and adjustment becomes possible.

The beam-shaped shielding elements may have any desired cross-sectional shape; according to FIGS. 1 to 3, they may, for instance, be rectangular. Preferably, however, the four beam-shaped shielding elements have, at least approximately, the cross-sectional shape of isosceles right triangles. One embodiment of a corresponding shielding device for magnetic apparatus according to the present invention is shown in FIGS. 4 to 6, where, corresponding to FIGS. 1 to 3, an oblique view is shown in FIG. 4, a partial cross section in FIG. 5, and a longitudinal section in FIG. 6. Parts which are the same as in FIGS. 1 to 3 are provided with the same reference symbols.

The shielding device 19 of a magnetic device 20 thus contains four beam-shaped shielding elements 22 to 25 with approximately triangular cross section. Together with approximately square end plates 27 and 28, they can be assembled to form a magnetic return, the transverse dimensions of which, in the case of a 1-Tesla magnet coil arrangement, are barely larger than the outside diameter of the magnet coil arrangement or the cryostat 3, respectively.

Deviating from the illustrations of the beam-shaped shielding element 10 to 13 and 22 to 25 shown in the Figures, each longitudinal beam can also be composed of several individual parallel beams, in order to reduce the individual unit weights. In particular, the triangular shape of the beams can be approximately by a number of smaller rectangular cross sections.

As a concrete example, the shielding device 19 shown in FIGS. 4 to 6 can be provided for a known superconducting 1-Tesla magnet, the vacuum tank of its cryostat 3 having a maximum flange diameter of 210 cm and a maximum axial length of 225 cm. Between the iron of the shielding device 19 and the cryostat 3 there remains on all sides a free space of 30 mm, especially for adjustment. The two end plates 27 and 28 therefore have transverse dimensions q of about 220 cm and the axial length L of the four triangular beams 22 to 25 is about 230 cm. The iron cross section of 0.84 m² required for 1-Tesla is divided uniformly over the four triangular beams 22 to 25. The two legs of the triangular cross section of each beam 22 to 25 each have a length l to 65 cm. The two end plates 27 and 28 with a maximum axial dimension a of 15 cm are each provided with a central opening 8, the radius of which is about 85 cm. For fine adjustment, shim rings 16 are further provided which reduce this radius to the radius $r_e$ of about 82 cm. The parts of the shielding device 19 may be made of cast steel or relatively simple grades of iron, since iron grades of higher quality such as transformer laminations practically improve neither the quality of the field nor the stray field. The shielding factor (field without iron/field with iron) of this shielding device is about 4 to 5.

What is claimed is:

1. In a magnetic device of a system for use in nuclear spin tomography comprising: several magnet coils which surround an interior suitable for receiving a body to be examined and generate therein an at least largely homogeneous magnetic field; and a cylindrical shielding device which consists of ferromagnetic material, surrounds the coils and includes a part with, at least largely, the shape of a cylinder, and, at its end faces, washer-like parts with central openings with a predetermined radius with respect to the cylinder axis, the improvement comprising: the approximately cylindrical part of the shielding device being made up of at least four beam-like shielding elements of at least identical design uniformly distributed over a common cylinder surface.

2. The improvement according to claim 1, wherein said beam-shaped shielding elements have a rectangular cross-sectional shape.

3. The improvement according to claim 1, wherein said beam-shaped shielding elements have triangular cross sections.

4. The improvement according to claim 3, and further including insertable rings for reducing the radius of the openings in said washer-shaped end plates of the shielding device to a predetermined value.

5. The improvement according to claim 2, and further including insertable rings for reducing the radius of the openings in said washer-shaped end plates of the shielding device to a predetermined value.

6. The improvement according to claim 1, and further including insertable rings for reducing the radius of the openings in said washer-shaped end plates of the shielding device to a predetermined value.

7. The improvement according to claim 6, wherein said magnet coils being superconducting are disposed within a cryostat which is surrounded by the shielding device.

8. The improvement according to claim 5, wherein said magnet coils being superconducting are disposed within a cryostat which is surrounded by the shielding device.

9. The improvement according to claim 4, wherein said magnet coils being superconducting are disposed within a cryostat which is surrounded by the shielding device.

10. The improvement according to claim 3, wherein said magnet coils being superconducting are disposed within a cryostat which is surrounded by the shielding device.

11. The improvement according to claim 2, wherein said magnet coils being superconducting are disposed within a cryostat which is surrounded by the shielding device.

12. The improvement according to claim 1, wherein said superconducting magnet coils are being superconducting disposed within a cryostat which is surrounded by the shielding device.

13. The improvement according to claim 12, wherein said shielding device at the same time is used as a mechanical mounting for the magnet coils.

14. The improvement according to claim 9, wherein said shielding device at the same time is used as a mechanical mounting for the magnet coils.

15. The improvement according to claim 6, wherein said shielding device at the same time is used as a mechanical mounting for the magnet coils.

16. The improvement according to claim 5, wherein said shielding device at the same time is used as a mechanical mounting for the magnet coils.

17. The improvement according to claim 4, wherein said shielding device at the same time is used as a mechanical mounting for the magnet coils.

18. The improvement according to claim 3, wherein said shielding device at the same time is used as a mechanical mounting for the magnet coils.

19. The improvement according to claim 2, wherein said shielding device at the same time is used as a mechanical mounting for the magnet coils.

20. The improvement according to claim 1, wherein said shielding device at the same time is used as a mechanical mounting for the magnet coils.

* * * * *